(12) United States Patent
Iwao

(10) Patent No.: US 10,804,077 B2
(45) Date of Patent: Oct. 13, 2020

(54) MICROWAVE PLASMA SOURCE, MICROWAVE PLASMA PROCESSING APPARATUS AND PLASMA PROCESSING METHOD

(71) Applicant: TOKYO ELECTRON LIMITED, Tokyo (JP)

(72) Inventor: Toshihiko Iwao, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 48 days.

(21) Appl. No.: 15/883,670

(22) Filed: Jan. 30, 2018

(65) Prior Publication Data
US 2018/0218883 A1 Aug. 2, 2018

(30) Foreign Application Priority Data
Feb. 1, 2017 (JP) .................... 2017-016664

(51) Int. Cl.
*H01J 37/32* (2006.01)
*H01J 37/244* (2006.01)
(Continued)

(52) U.S. Cl.
CPC .. *H01J 37/32311* (2013.01); *C23C 16/45544* (2013.01); *C23C 16/511* (2013.01);
(Continued)

(58) Field of Classification Search
None
See application file for complete search history.

(56) References Cited

U.S. PATENT DOCUMENTS

| 2010/0101728 A1* | 4/2010 | Iwasaki | H01J 37/32192 |
| | | | 156/345.33 |
| 2014/0124478 A1* | 5/2014 | Yoshikawa | H01J 37/3266 |
| | | | 216/69 |

(Continued)

FOREIGN PATENT DOCUMENTS

| EP | 0653775 A1 | 5/1995 |
| JP | 2000-294550 A | 10/2000 |

(Continued)

*Primary Examiner* — Mounir S Amer
(74) *Attorney, Agent, or Firm* — Nath, Goldberg & Meyer; Jerald L. Meyer

(57) ABSTRACT

A microwave plasma source for generating a microwave plasma inside a chamber by radiating a microwave into the chamber, includes: a microwave oscillator for oscillating the microwave and vary an oscillation frequency thereof; a waveguide through which the microwave propagates; an antenna part including a slot antenna for radiating the microwave into the chamber and having a predetermined pattern of slots, and a microwave-transmitting plate constituting a ceiling plate of the chamber and made of a dielectric material through which the microwave radiated from the slots transmits; temperature detectors for detecting temperatures at plural positions of the antenna part outside the chamber when the microwave plasma is generated; and a frequency controller for receiving detection signals obtained by the temperature detectors and controlling the oscillation frequency of the microwave oscillator so that a plasma density distribution inside the chamber becomes a desired distribution based on the detection signals.

14 Claims, 10 Drawing Sheets

(51) Int. Cl.
*H01L 21/67* (2006.01)
*H01L 21/66* (2006.01)
*C23C 16/455* (2006.01)
*C23C 16/52* (2006.01)
*C23C 16/511* (2006.01)
*H01L 21/02* (2006.01)
*H01L 21/687* (2006.01)

(52) U.S. Cl.
CPC ............ *C23C 16/52* (2013.01); *H01J 37/244* (2013.01); *H01J 37/3222* (2013.01); *H01J 37/3299* (2013.01); *H01J 37/32201* (2013.01); *H01J 37/32229* (2013.01); *H01J 37/32522* (2013.01); *H01J 37/32935* (2013.01); *H01L 21/67248* (2013.01); *H01L 21/67253* (2013.01); *H01L 22/26* (2013.01); *H01J 37/3244* (2013.01); *H01J 37/32834* (2013.01); *H01J 2237/332* (2013.01); *H01L 21/0217* (2013.01); *H01L 21/0228* (2013.01); *H01L 21/02211* (2013.01); *H01L 21/02274* (2013.01); *H01L 21/68757* (2013.01)

(56) References Cited

U.S. PATENT DOCUMENTS

| | | | |
|---|---|---|---|
| 2015/0015139 A1* | 1/2015 | Kaneko | H01J 37/32229 315/34 |
| 2016/0093474 A1* | 3/2016 | Ishibashi | H05H 1/46 216/69 |
| 2017/0318627 A1* | 11/2017 | Won | F27D 7/06 |

FOREIGN PATENT DOCUMENTS

| | | |
|---|---|---|
| JP | 2007-227311 A | 9/2007 |
| JP | 2012-109080 A | 6/2012 |
| WO | 2004012252 A1 | 2/2004 |

* cited by examiner

FIG. 5

| Frequency (MHz) | 2410 | 2420 | 2430 | 2440 | 2445 | 2450 | 2455 |
|---|---|---|---|---|---|---|---|
| Argon mixed gas | | | | | | | |

| Frequency (MHz) | 2460 | 2465 | 2470 | 2475 | 2480 | 2490 | 2500 |
|---|---|---|---|---|---|---|---|
| Argon mixed gas | | | | | | | |

Corner high: 2410–2430
Center high: 2465

| Frequency (MHz) | 2420 | 2460 | 2465 | 2470 |
|---|---|---|---|---|
| Taper connector temperature (°C) | 72.2 | 79.1 | 79.2 | 79.7 |
| IR center temperature (°C) | 71.4 | 75.9 | 75.7 | 75.9 |
| Argon mixed gas (No.1) |  |  |  |  |
| Frequency (MHz) | 2420 | 2460 | 2480 | 2490 |
| Taper connector temperature (°C) | 72.4 | 76.6 | 81.7 | 75.5 |
| IR center temperature (°C) | 71.6 | 73.1 | 76.4 | 74.2 |
| Argon mixed gas (No.2) |  |  |  |  |

FIG. 9

| Frequency (MHz) | 2460 | 2460 | 2460 | 2460 | 2460 | 2460 | 2460 |
|---|---|---|---|---|---|---|---|
| Power (W) | 500 | 750 | 1000 | 1250 | 1500 | 1750 | 2000 |
| Argon mixed gas (No.1) | | | | | | | |
| Argon mixed gas (No.2) | | | | | | | |

MICROWAVE PLASMA SOURCE, MICROWAVE PLASMA PROCESSING APPARATUS AND PLASMA PROCESSING METHOD

CROSS-REFERENCE TO RELATED APPLICATION

This application is based upon and claims the benefit of priority from Japanese Patent Application No. 2017-016664, filed on Feb. 1, 2017, the entire contents of which are incorporated herein by reference.

TECHNICAL FIELD

The present disclosure relates to a microwave plasma source, a microwave plasma processing apparatus and a plasma processing method.

BACKGROUND

Plasma processing is an indispensable technology for manufacturing semiconductor devices. In recent years, an increasing number of highly-integrated and faster Large Scale Integrated (LSI) circuits are in demand, and thus the design rule for semiconductor devices constituting LSIs is becoming more miniaturized and semiconductor wafers are becoming larger in size. As such, there is a need for a plasma processing apparatus to cope with such miniaturization and increasing size.

A parallel plate type or inductively coupled type plasma processing apparatus has been conventionally used as a plasma processing apparatus, but there is difficulty in treating large-sized semiconductor wafers with plasma uniformly and at high speed.

In this connection, an RLSA® microwave plasma processing apparatus which is capable of uniformly forming surface wave plasma with low electron temperature and high density is attracting attention.

The RLSA® microwave plasma processing apparatus includes a planar slot antenna having a plurality of slots formed therein with a predetermined pattern. The slot antenna is installed in an upper portion of a chamber. In this apparatus, a microwave guided from a microwave generator is guided to the slot antenna through a slow-wave member made of a dielectric material. The microwave is radiated from the slots of the slot antenna. The microwave transmits through a ceiling wall of the chamber made of a dielectric material into the chamber kept at vacuum. Thus, surface wave plasma is generated inside the chamber. By the generated plasma, a gas introduced into the chamber is plasmarized so that a workpiece such as a semiconductor wafer is processed.

In addition, there has been proposed another RLSA® microwave plasma processing apparatus in which a temperature control device equipped with a temperature sensor is installed in an antenna-incorporated member and the temperature of the antenna, and temperatures of the antenna and a member positioned near the antenna are controlled to fall within a predetermined temperature range.

In addition, there has been proposed still another RLSA® microwave plasma processing apparatus in which a microwave having a predetermined frequency band width is generated by modulating a carrier wave, and deviation of an electric field caused by interference between standing waves of the microwave or between microwaves radiated from slots is alleviated.

Incidentally, in the conventional RLSA® microwave plasma processing apparatuses, the radiation characteristics of the microwave are determined by a slot pattern of the slot antenna and a plasma density distribution is determined accordingly. As such, a slot antenna having slots of a pattern that provides a desired plasma density distribution is used.

However, the plasma density distribution at the time of generating the microwave plasma using the slot antenna is varied depending on microwave power, gas conditions or the like. This makes it difficult to control the plasma density distribution with high precision only by determining the slot pattern.

SUMMARY

Some embodiments of the present disclosure provide a technology capable of controlling a plasma density distribution with high precision when generating a microwave plasma using a slot antenna.

According to one embodiment of the present disclosure, there is provided a microwave plasma source for generating a microwave plasma inside a chamber by radiating a microwave into the chamber, including: a microwave oscillator configured to oscillate the microwave and vary an oscillation frequency of the microwave; a waveguide through which the microwave oscillated by the microwave oscillator propagates; an antenna part including a slot antenna and a microwave-transmitting plate, the slot antenna being configured to radiate the microwave propagating through the waveguide into the chamber and having a predetermined pattern of slots formed therein, and the microwave-transmitting plate constituting a ceiling plate of the chamber and being made of a dielectric material through which the microwave radiated from the slots transmits; a plurality of temperature detectors configured to detect temperatures at a plurality of positions of the antenna part outside the chamber when the microwave plasma is generated inside the chamber; and a frequency controller configured to receive detection signals obtained by the plurality of temperature detectors and control the oscillation frequency of the microwave oscillator so that a plasma density distribution inside the chamber becomes a desired distribution, based on the detection signals.

According to another embodiment of the present disclosure, there is provided a microwave plasma processing apparatus including: a chamber in which a workpiece is accommodated; a microwave oscillator configured to oscillate the microwave and vary an oscillation frequency of the microwave; a waveguide through which the microwave oscillated by the microwave oscillator propagates; an antenna part including a slot antenna and a microwave-transmitting plate, the slot antenna being configured to radiate the microwave propagating through the waveguide into the chamber and having a predetermined pattern of slots formed therein, and the microwave-transmitting plate constituting a ceiling plate of the chamber and being made of a dielectric material through which the microwave radiated from the slots transmits; a plurality of temperature detectors configured to detect temperatures at a plurality of positions of the antenna part outside the chamber when the microwave plasma is generated inside the chamber; and a frequency controller configured to receive detection signals obtained by the plurality of temperature detectors and control the oscillation frequency of the microwave oscillator so that a plasma density distribution inside the chamber becomes a desired distribution, based on the detection signals; a gas supply mechanism configured to supply a plasma processing gas into the chamber; and an exhaust mechanism configured to exhaust an interior of the chamber.

According to another embodiment of the present disclosure, there is provided a plasma processing method for performing a plasma process using a microwave plasma processing apparatus, the microwave plasma processing apparatus includes: a chamber in which a workpiece is accommodated; a microwave oscillator configured to oscillate the microwave and vary an oscillation frequency of the microwave; a waveguide through which the microwave oscillated by the microwave oscillator propagates; an antenna part including a slot antenna and a microwave-transmitting plate, the slot antenna being configured to radiate the microwave propagating through the waveguide into the chamber and having a predetermined pattern of slots formed therein, and the microwave-transmitting plate constituting a ceiling plate of the chamber and being made of a dielectric material through which the microwave radiated from the slots transmits; a gas supply mechanism configured to supply a plasma processing gas into the chamber; and an exhaust mechanism configured to exhaust an interior of the chamber, the method including: detecting temperatures at a plurality of positions of the antenna part outside the chamber and outputting a plurality of temperature detection signals; and controlling the oscillation frequency of the microwave oscillator so that a plasma density distribution inside the chamber becomes a desired distribution, based on the plurality of temperature detection signals.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a view showing the results of temperature distribution measurement on a bottom surface of a ceiling plate when a microwave frequency is changed in a range of 2,410 to 2,500 MHz.

FIG. 9 is a view showing the results of temperature distribution measurement in a bottom surface of a ceiling plate when power is changed while a microwave frequency is fixed.

DETAILED DESCRIPTION

Hereinafter, embodiments of the present disclosure will be described in detail with reference to the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Configuration of Microwave Plasma Processing Apparatus>

Figure 1:
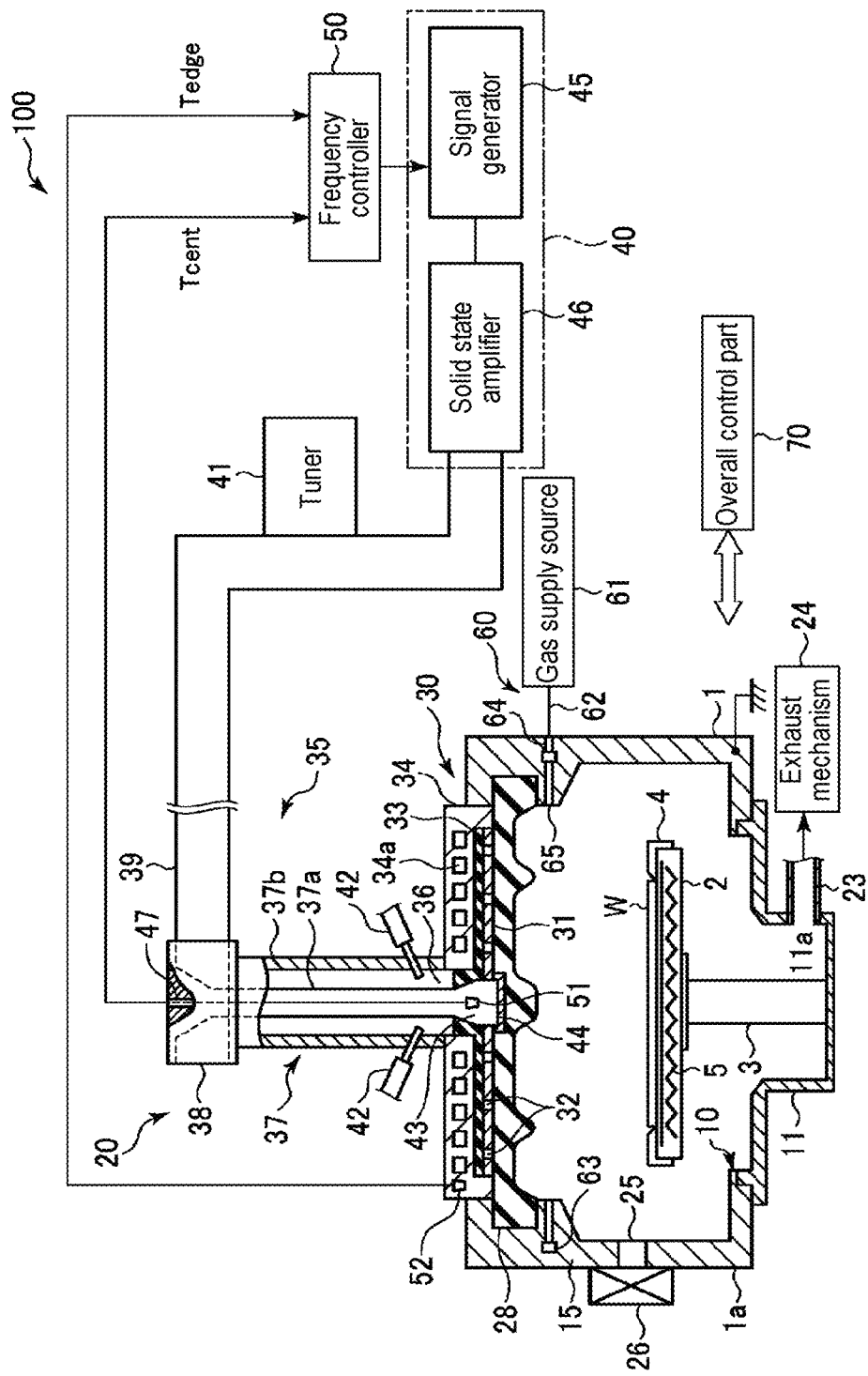
FIG. 1 is a sectional view schematically showing the configuration of a microwave plasma processing apparatus according to an embodiment of the present disclosure.

FIG. 1 is a sectional view schematically showing the configuration of a microwave plasma processing apparatus according to an embodiment of the present disclosure. The microwave plasma processing apparatus shown in FIG. 1 is a microwave plasma processing apparatus using a slot antenna, such as an RLSA® microwave plasma processing apparatus, to perform a plasma process on an insulating film, for example, a nitride film of SiN or the like.

As shown in FIG. 1, the microwave plasma processing apparatus 100 includes a grounded airtight chamber 1. An opening 10 is formed in the substantially central portion of a bottom wall 1a of the chamber 1. An exhaust chamber 11 communicating with the opening 10 and protruding downward is provided in the bottom wall 1a.

A susceptor 2 made of ceramics such as AlN to horizontally support a workpiece, for example, a semiconductor wafer (hereinafter simply referred to as "wafer") W is installed inside the chamber 1. The susceptor 2 is supported by a cylindrical support member 3 made of ceramics such as AlN and extending upward from the center of the bottom of the exhaust chamber 11. A guide ring 4 for guiding the wafer W is installed in an outer peripheral portion of the susceptor 2. In addition, a resistance heater 5 is embedded in the susceptor 2. When the heater 5 is powered on, the susceptor 2 is heated so that the wafer W is heated.

Wafer support pins (not shown) for vertically lifting the wafer W while supporting the wafer W are installed in the susceptor 2 so as to be moved upward and downward on the surface of the susceptor 2.

An exhaust pipe 23 is connected to a side surface of the exhaust chamber 11. An exhaust mechanism 24 including a vacuum pump, an automatic pressure control valve and so on is connected to the exhaust pipe 23. The vacuum pump of the exhaust mechanism 24 is actuated to discharge a gas inside the chamber 1 evenly into a space 11a of the exhaust chamber 11 and exhaust the gas through the exhaust pipe 23. Thus, the interior of the chamber 1 can be controlled to have a predetermined degree of vacuum by the automatic pressure control valve.

In the side wall of the chamber 1 are installed a loading/unloading port 25 through which the wafer W is transferred between the chamber 1 and a transfer chamber (not shown) provided adjacent to the microwave plasma processing apparatus 100, and a gate valve 26 for opening/closing the loading/unloading port 25.

An upper portion of the chamber 1 defines an opening. A microwave plasma source 20 is installed so as to face the opening.

The microwave plasma source 20 includes an antenna part 30 and a microwave transmission part 35.

The antenna part 30 includes a microwave-transmitting plate 28, a slot antenna 31 and a slow-wave member 33.

The microwave-transmitting plate 28 is made of a dielectric material, for example, ceramics such as quartz or $Al_2O_3$ and is fitted in the upper portion of the side wall of the chamber 1 so as to close the opening of the chamber 1. The chamber 1 and the microwave-transmitting plate 28 are in close contact with each other by a seal ring so that the interior of the chamber 1 is air-tightly sealed.

The slot antenna 31 has a disc shape corresponding to the microwave-transmitting plate 28 and is installed so as to be in close contact with the microwave-transmitting plate 28. The slot antenna 31 is engaged with an upper end of the side wall of the channel 1. The slot antenna 31 is formed of a conductive disk.

The slot antenna 31 is composed of a copper plate or an aluminum plate whose surface is plated with silver or gold, and has a plurality of slots 32 for radiating microwaves, formed with a predetermined pattern so as to penetrate through the plate. The pattern of the slots 32 may be appropriately set so that the microwaves are evenly radiated. Examples of the pattern may include a pattern in which a plurality of pairs of slots 32 is concentrically arranged, with each pair composed of two slots 32 paired in a T-shape. The length and the arrangement interval of the slots 32 are determined depending on the effective wavelength (λg) of a microwave. For example, the slots 32 are arranged at an interval of λg/4, λg/2 or λg. The slots 32 may have other shapes such as a circular shape, an arc shape, or the like. The arrangement mode of the slots 32 is not particularly limited. For example, the slots 32 may be arranged in other shapes other than concentrically such as spirally or radially as examples. The pattern of the slots 32 may be appropriately set so as to provide the microwave radiation characteristics with which a desired plasma density distribution is obtained.

The slow-wave member 33 is installed in close contact with the upper surface of the slot antenna 31. The slow-wave member 33 is made of a dielectric material having a larger dielectric constant than a vacuum, for example, quartz, ceramics ($Al_2O_3$), a resin such as polytetrafluoroethylene or polyimide, or the like. The slow-wave member 33 has a function of making the wavelength of the microwave shorter than that in a vacuum, thereby making the slot antenna 31 smaller.

The thicknesses of the microwave-transmitting plate 28 and the slow-wave member 33 are adjusted so that an equivalent circuit configured by the slow-wave member 33, the slot antenna 31, the microwave-transmitting plate 28 and plasma meets resonance conditions. By adjusting the thickness of the slow-wave member 33, the phase of the microwave can be adjusted. The thickness of the slow-wave member 33 is adjusted so that a connection portion with the slot antenna 31 becomes an "antinode" of a standing wave. Thus, the reflection of the microwave is minimized and the radiant energy of the microwave is maximized. In addition, the reflection of the microwave in the interface can be prevented when the slow-wave member 33 and the microwave-transmitting plate 28 are made of the same material.

The slot antenna 31 and the microwave-transmitting plate 28 may be spaced apart from each other. Further, the slow-wave member 33 and the slot antenna 31 may be spaced apart from each other.

The antenna part 30 further includes a shield lid 34 made of a metal material such as aluminum, stainless steel, copper or the like to cover the slot antenna 31 and the slow-wave member 33. The shield lid 34 includes a cooling water flow path 34a formed therein. By flowing cooling water through the cooling water flow path 34a, the seal lid 34, the slow-wave member 33, the slot antenna 31 and the microwave-transmitting plate 28 are cooled down. The shield lid 34 is grounded.

The microwave transmission part 35 includes a coaxial waveguide 37, a mode converter 38, a waveguide 39, a microwave oscillator 40 and a tuner 41.

The coaxial waveguide 37 is inserted into an opening 36 formed at the center of an upper wall of the sealed lid 34. The coaxial waveguide 37 includes a hollow rod-shaped inner conductor 37a and a cylindrical outer conductor 37b which are concentrically arranged with each other and extend upward. A tapered connector 43 formed at the lower end of the inner conductor 37a is connected to the slot antenna 31. A metallic cover 44 is installed at the leading end of the tapered connector 43.

The mode converter 38 is connected to an upper end of the coaxial waveguide 37. The waveguide 39 is connected to the mode converter 38. The waveguide 39 is rectangular in section. One end of the waveguide 39 is connected to the mode converter 38 and the other end thereof is connected to the microwave oscillator 40.

The microwave oscillator 40 includes a signal generator 45 and a solid state amplifier 46. The solid state amplifier 46 amplifies a signal waveform provided from the signal generator 45 to oscillate a microwave with predetermined power and has a frequency modulation function. For example, if the center frequency of the microwave is 2,450 MHz (2.45 GHz), the solid state amplifier 46 can modulate the frequency of the microwave in a range of 2,400 to 2,500 MHz (2.4 and 2.5 GHz). The center frequency of the microwave is not limited to 2,450 MHz but may include various frequencies such as 8.35 GHz, 1.98 GHz, 860 MHz, 915 MHz or the like.

The tuner 41 is installed in the middle of the waveguide 39 and is used to match the impedance of a load (plasma) inside the chamber 1 with the characteristic impedance of a power supply of the microwave oscillator 40.

The microwave oscillated by the microwave oscillator 40 propagates through the waveguide 39 in a TE mode. The propagation mode of the microwave is converted by the mode converter 38 from the TE mode to a TEM mode. The microwave thus converted is guided to the slot antenna 31 through the coaxial waveguide 37. On the other hand, even if the mode conversion is performed in the mode converter 38, the TE mode remains slightly. However, such remaining TE mode components are converted to the TEM mode in the course of propagating through the coaxial waveguide 37.

A hole 47 extending from above to the tapered connector 43 is formed in the central portion of the inner conductor 37a of the coaxial waveguide 37. A first thermocouple 51 serving as a temperature detector is inserted to a position at which the tapered connector 43 is installed. The first thermocouple 51 detects a temperature of the central portion of the antenna part 30. On the other hand, a second thermocouple 52 serving as a temperature detector is installed at an edge portion of the sealed lid 34 to detect a temperature of the edge portion of the antenna part 30. A signal of an antenna part center temperature ($T_{cent}$) detected by the first thermocouple 51 and a signal of an antenna part edge portion temperature ($T_{edge}$) detected by the second thermocouple 52 are inputted to a frequency controller 50 which controls the frequency of the microwave. Both the first thermocouple 51 and the second thermocouple 52 are inserted from the outside of the antenna part 30 and are disposed in an atmospheric environment Based on the signals Tcent and Tedge detected by the first thermocouple 51 and the second thermocouple 52, the frequency controller 50 instructs the microwave oscillator 40 to optimize a plasma density distribution and controls an oscillation frequency of microwaves to be generated from the microwave oscillator 40. That is to say, the signals Tcent and Tedge are correlated with the temperatures of the central portion and the edge portion in the bottom surface of the microwave-transmitting plate 28 inside the chamber 1. Further, by varying the oscillation frequency of the microwave, the distribution of an electric field radiated from the slot antenna 31 is adjusted, thus controlling the plasma density distribution. It is therefore possible to control the plasma density distribution with high precision.

The microwave plasma source 20 includes a plurality of stub members 42 which are circumferentially installed in a lower portion of the coaxial waveguide 37 and extend from the outer conductor 37b toward the inner conductor 37a. Each of the stub members 42 has a function of circumferentially adjusting the propagation of microwaves by adjusting a distance between a leading end of the respective stub member 42 and the inner conductor 37a.

The microwave plasma processing apparatus 100 further includes a gas supply mechanism 60 configured to supply a gas into the chamber 1 through the side wall of the chamber 1. The gas supply mechanism 60 includes a gas supply source 61, a pipe 62 extending from the gas supply source 61, a buffer chamber 63 installed annularly along the side wall of the chamber 1, a gas flow path 64 connecting the pipe 62 and the buffer chamber 63, and a plurality of gas discharge ports 65 formed horizontally at equal intervals from the buffer chamber 63 so as to face the chamber 1.

The gas supply mechanism 60 is configured to supply an appropriate gas according to a plasma process. Examples of the gas may include a rare gas such as an Ar gas, which is a plasma generating gas, and a processing gas. An example of the plasma process may include a nitriding process. Examples of the processing gas supplied in the nitriding process may include a $H_2$ gas, a nitriding gas such as a $N_2$ gas or a $NH_3$ gas. In a case of forming an insulating film by plasma CVD, a precursor gas and a reaction gas may be supplied as the processing gas. For example, in the case of forming a SiN film as an insulating film, a Si precursor gas such as monosilane (SiH4) or disilane (Si2H6) is used as the precursor gas, a H2 gas and a nitriding gas such as a N2 gas or an ammonia (NH3) gas are used as the reaction gas. At this time, a target to be plasmarized by microwave plasma is mainly the nitriding gas. The apparatus of this embodiment can also be applied in forming an insulating film using ALD (Atomic Layer Deposition). In this case, a precursor gas and a reaction gas are alternately supplied and plasma is ignited at the time of supplying the reaction gas. For example, the adsorption of the Si precursor onto the wafer W and the plasma-based nitridation are alternately repeated.

The number of gas supply sources 61 corresponds to the number of gases. Pipes 62 are installed to extend from respective gas supply sources 61. A valve (not shown) and a flow rate controller (not shown) such as a mass flow controller are installed in each of the pipes 62.

The microwave plasma processing apparatus 100 includes an overall control part 70. The overall control part 70 includes a main control part equipped with a CPU (computer) for controlling the respective components of the microwave plasma processing apparatus 100, for example, the microwave oscillator 40, a power supply for the heater 5, the exhaust mechanism 24, the valve and the flow rate controller of the gas supply mechanism 60 and the like, an input device (keyboard, mouse, etc.), an output device (printer, etc.), a display device (display, etc.) and a storage device (storage medium). Parameters of various processes to be executed in the microwave plasma processing apparatus 100 are stored in the storage device. In addition, a storage medium in which programs for controlling the processes to be executed in the microwave plasma processing apparatus 100, namely processing recipes, are stored in the storage device. The main control part calls a predetermined processing recipe stored in the storage medium and controls the microwave plasma processing apparatus 100 to perform a predetermined process based on the called processing recipe.

<Operation of Microwave Plasma Processing Apparatus>

Next, the operation of the microwave plasma processing apparatus 100 configured as above will be described.

First, with the gate valve 26 opened, the wafer W as a target substrate is loaded into the chamber 1 through the loading/unloading port 25 and is mounted on the susceptor 2.

Subsequently, the interior of the chamber 1 is exhausted to have a predetermined pressure. Microwaves are introduced into the chamber 1 while a predetermined gas is introduced from the gas supply mechanism 60 into the chamber 1. For example, a microwave with predetermined power is oscillated from the microwave oscillator 40 while a plasma generating gas such as an Ar gas, and a nitriding gas are introduced into the chamber 1. The oscillated microwave propagates through the waveguide 39 in the TE mode. The TE mode is converted to a TEM mode by the mode converter 38. The microwave converted to the TEM mode propagates through the coaxial waveguide 37 and is radiated into the chamber 1 through the slow-wave member 33, the slots 32 of the slot antenna 31, and the microwave-transmitting plate 28.

The microwave spreads, as a surface wave, only toward a region directly under the microwave-transmitting plate 28, thereby generating surface wave plasma. The plasma diffuses downward and becomes plasma with high electron density and low electron temperature in an arrangement region of the wafer W.

A plasma density distribution inside the chamber 1 at this time was conventionally adjusted mainly by using the slot antenna 31 having a slot pattern which is microwave radiation characteristics for obtaining a desired plasma density distribution. However, the plasma density distribution when the microwave plasma is generated using the slot antenna 31 may fluctuate depending on the microwave power, the gas condition and the like. Therefore, it is difficult to control the plasma density distribution with high precision merely by determining the slot pattern. Although the propagation of the microwave can be adjusted in the circumferential direction by the stub members 42 to correct the non-uniformity of the electric field, it is difficult to control the plasma density distribution with high precision.

In contrast, in the present embodiment, the microwave oscillator 40 capable of varying an oscillation frequency is used to operate the distribution of the electric field radiated from the slot 32 of the slot antenna 31, thereby controlling the plasma density distribution.

On this point, a description will be made in detail below. In the present embodiment, an amplifier having a frequency modulation function is used as the solid state amplifier 46. For example, the solid state amplifier 46 can vary the frequency of the microwave in a range of 2,400 MHz to 2,500 MHz with respect to the center frequency of 2,450 MHz. By varying the microwave frequency in this way, the radiation characteristics of the microwave radiated from the slots 32 of the slot antenna 31 can be changed, thus changing the distribution of the electric field radiated from the slots 32. As the distribution of the electric field changes in this manner, the plasma density distribution is also changed. Therefore, by changing the frequency of the microwave, it is possible to control the plasma density distribution. Further, even if the plasma density distribution deviates from an aimed distribution by a slot pattern depending on microwave power, gas conditions or the like, it is possible to control the plasma density distribution at a desired level with high precision. For example, in a slot pattern in which a plasma density is made uniform, when the plasma density becomes uneven, it is possible to make the plasma density uniform with high precision by the aforementioned control.

On the other hand, the control of the plasma density distribution requires measuring a temperature (which is an index of the plasma density) of the lower surface of the microwave-transmitting plate 28 constituting the ceiling plate of the chamber 1. However, such a measurement requires measuring the temperature with a radiation thermometer, an infrared thermography or the like through the chamber 1. This makes it difficult for a typical apparatus to perform such a measurement.

Therefore, as a result of studies made by the present inventors, it has been found that a temperature measured at a portion of the antenna part 30, which is positioned outside the chamber 1, is correlated with the temperature of the lower surface of the microwave-transmitting plate 28, which is positioned inside the chamber 1.

Accordingly, in the present embodiment, the first thermocouple 51 serving as a temperature detector is inserted to reach the tapered connector 43 through the hole 47 of the inner conductor 37a of the coaxial waveguide 37 so as to measure the antenna part center temperature (Tcent). In addition, the second thermocouple 52 serving as a temperature detector is installed in the edge portion of the shield lid 34 so as to measure the antenna part edge temperature (Tedge). This makes it possible to measure the temperature of the antenna part 30, which is correlated with the temperature (an index of the plasma density) of the lower surface of the microwave-transmitting plate 28, at the center and edge portions of the antenna part, thereby monitoring the plasma density distribution.

The signal of the antenna part center temperature (Tcent) detected by the first thermocouple 51 and the signal of the antenna part edge temperature (Tedge) detected by the second thermocouple 52 are inputted to the frequency controller 50 for controlling the microwave frequency. The frequency controller 50 controls the oscillation frequency of the microwave oscillated from the microwave oscillator 40 based on the temperature signals.

Specifically, the frequency controller 50 has, as a database, the relationship between the frequency and the plasma density distribution according to a microwave power, a gas type and a gas composition. The frequency controller 50 issues a frequency command to the signal generator 45 so that the microwave plasma density distribution obtained from the signal of the antenna part center temperature (Tcent) and the signal of the antenna part edge temperature (Tedge) has a desired value. The microwave oscillator 40 oscillates a microwave of a given frequency using the frequency modulation function of the solid state amplifier 46.

In this manner, it is possible to monitor the plasma density distribution through an extremely simplified method which measures the temperature outside the antenna part 30 using a temperature detector such as a thermocouple. If the temperature measurement position is set to a position closer to the plasma, the temperature can be measured with higher precision. In this case, since a thermocouple cannot be used on a microwave line, it is necessary to measure the temperature with a fiber thermometer or the like. However, as in the present embodiment, it is more stable to measure the temperature with a thermocouple at a position away from a microwave line located at the atmosphere side of the antenna part 30.

As described above, according to the present embodiment, it is possible to adjust the plasma density distribution by modulating the oscillation frequency of the microwave and to monitor the plasma density distribution by measuring the temperatures of the center and edge portions of the antenna portion 30, which are positioned outside the chamber 1. Thus, the plasma density distribution can be controlled with high precision by controlling the oscillation frequency of the microwave based on the plasma density distribution thus monitored. In this case, the plasma density distribution may be controlled so that the plasma density becomes uniform, or may be controlled so as to become a predetermined distribution.

<Experiment for Verification>

Next, an experiment for verifying the present disclosure will be described.

Figure 2:
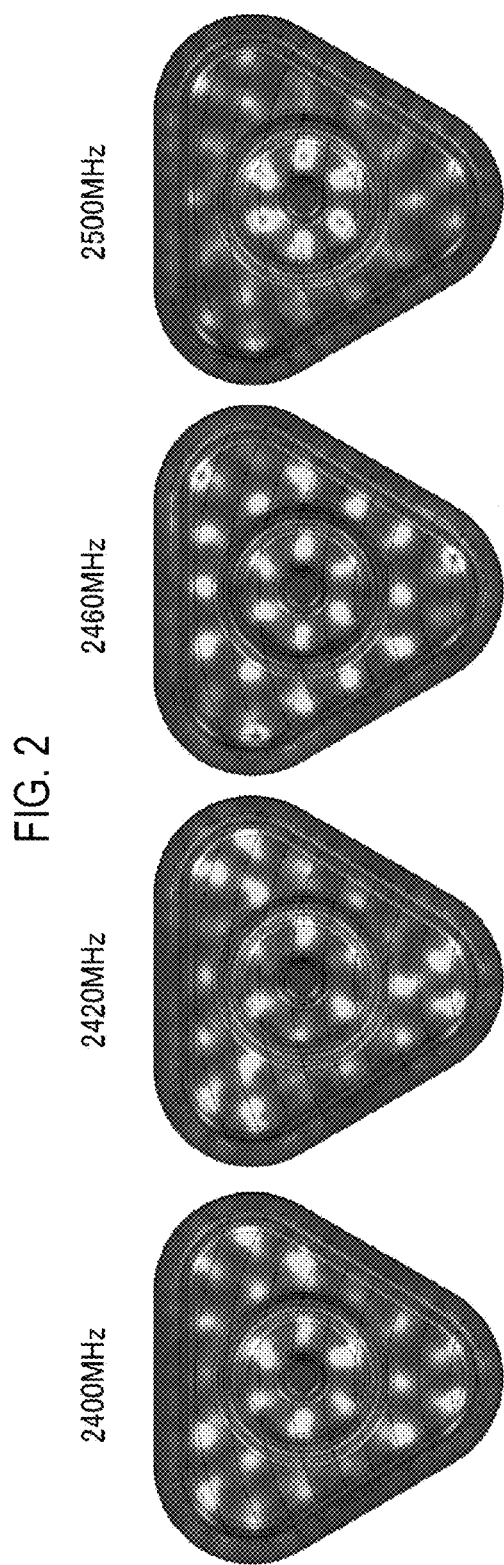
FIG. 2 is a view showing an electric field distribution in a lower surface of a microwave-transmitting plate when a microwave frequency is changed in the microwave plasma processing apparatus by an electromagnetic simulation.

First, an electric field distribution in the lower surface of the microwave-transmitting plate when the microwave frequency was changed in the microwave plasma apparatus was obtained by an electromagnetic simulation. FIG. 2 is a view showing an electric field strength distribution at each frequency. In FIG. 2, a high electric field intensity is indicated by white and a low electric field intensity is indicated by black.

As can be seen from FIG. 2, the results of the simulation shows that the electric field distribution in the lower surface of the microwave-transmitting plate is changed by varying the microwave frequency. That is to say, it was confirmed by the simulation that the plasma density distribution can be controlled by varying the microwave frequency.

Next, an experiment was conducted in which plasma was actually generated by varying the microwave frequency by an experimental apparatus.

Figure 3:
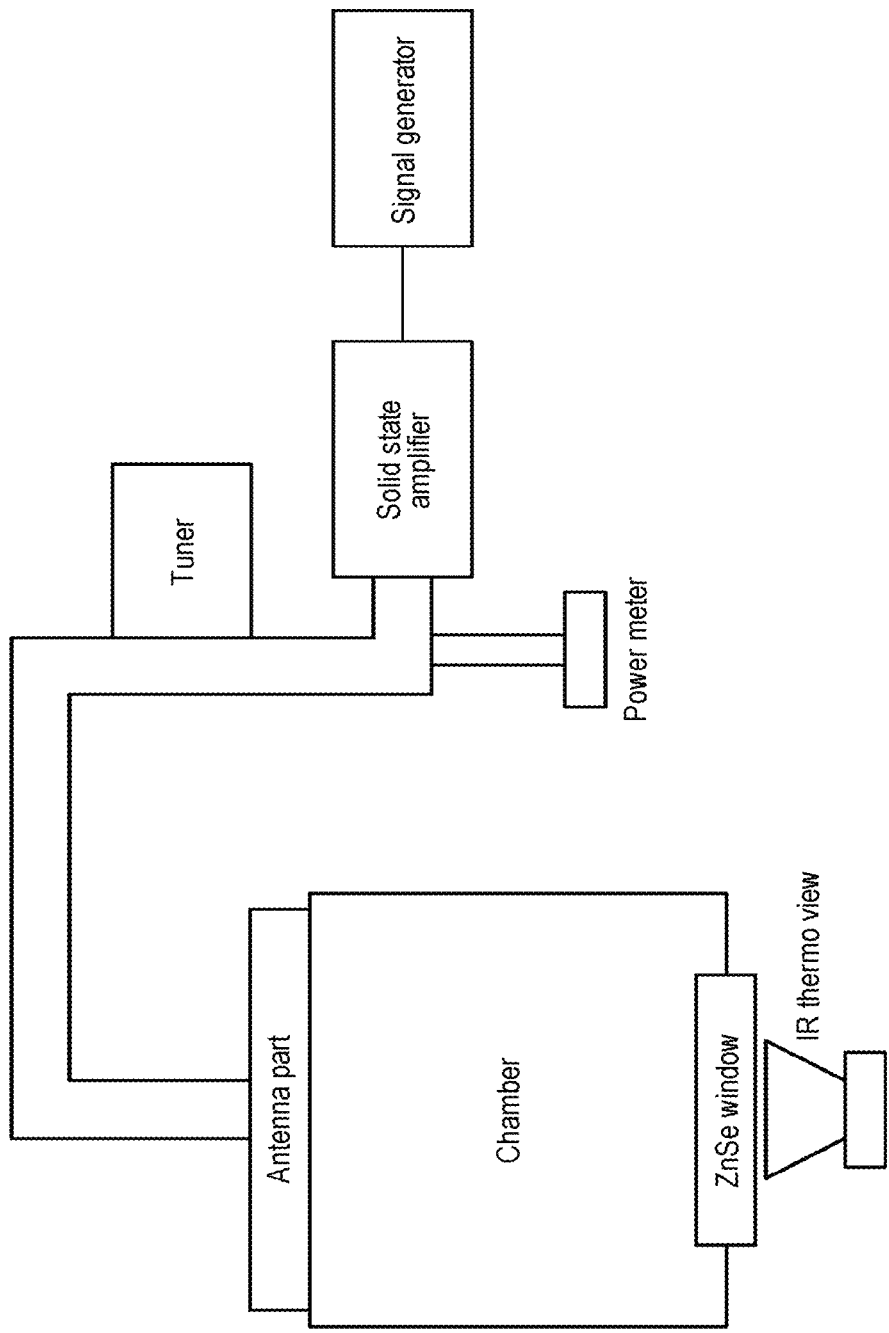
FIG. 3 is a view schematically showing the configuration of an experimental apparatus when an experiment in which plasma is actually generated by changing the frequency of a microwave is performed.

As shown in FIG. 3, similarly to the apparatus of FIG. 1, the experimental apparatus includes, as a microwave oscillator, a signal generator and a solid state amplifier. The experimental apparatus irradiates a microwave into a hollow chamber through a waveguide, a coaxial waveguide and an antenna part including a slot antenna. A susceptor is not installed inside the hollow chamber. The experimental apparatus is configured to measure the temperature of the lower surface of the ceiling plate (microwave-transmitting plate) of the antenna part from the bottom portion of the chamber through the use of an IR thermo viewer (infrared thermography).

Figure 4:
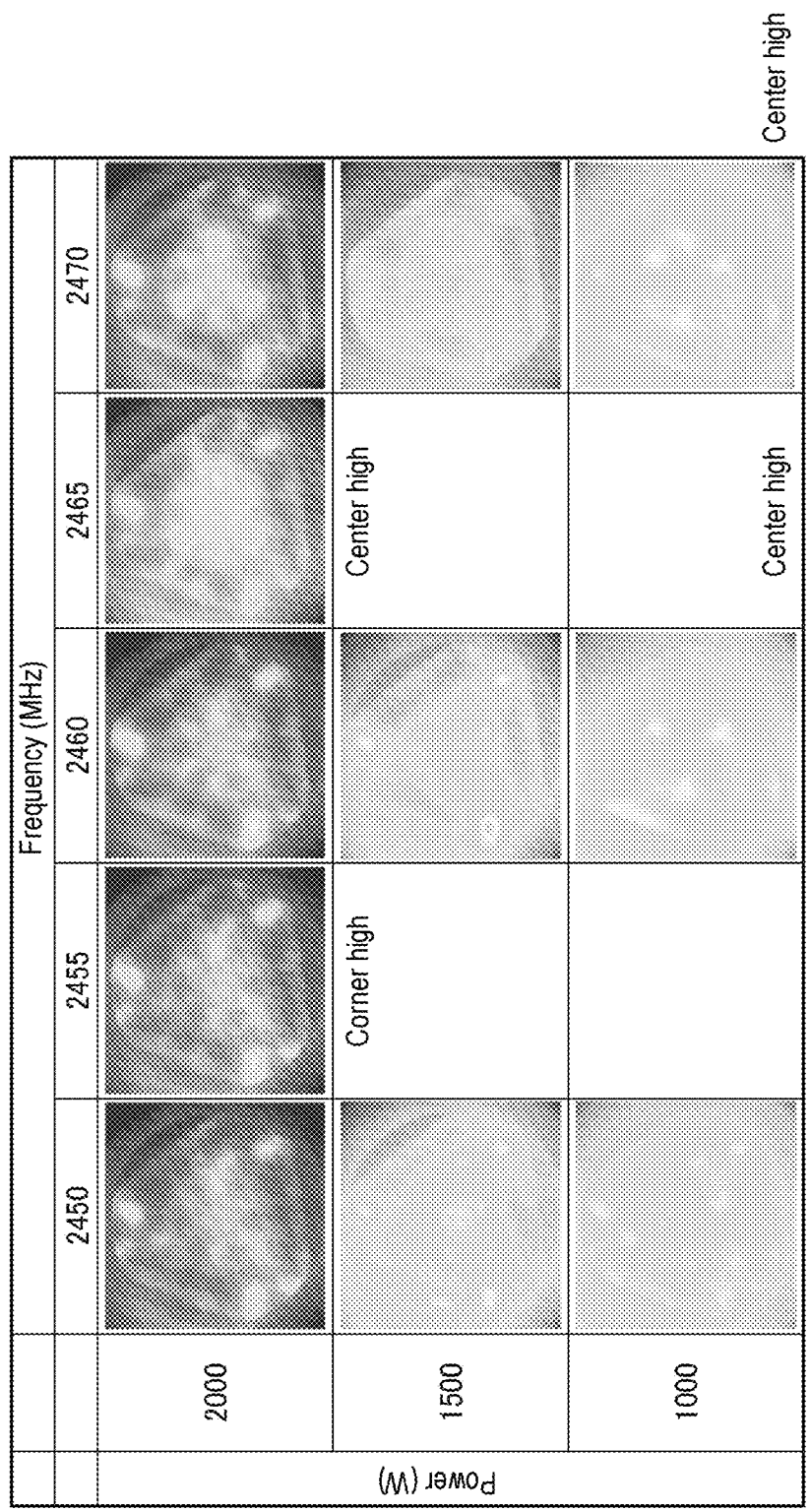
FIG. 4 is a view showing the results of temperature distribution measurement in a bottom surface of a ceiling plate when a microwave frequency is changed in a range of 2,450 to 2,470 MHz and power is changed in a range of 1,000 to 2,000 W.

Using the experimental apparatus shown in FIG. 3, under the condition that an argon mixed gas composed of a $NH_3$ gas, a $H_2$ gas and an Ar gas is used as a processing gas and an internal pressure of the chamber is set to 2 Torr, the microwave frequency was varied in a range of 2,450 MHz to 2,470 MHz and power was changed in a range of 1,000 to 2,000 W. The temperature of the lower surface of the ceiling plate at that time has fallen within a predetermined range of 50 and 100 degrees C. FIG. 4 shows the results of temperature distribution measurement in the lower surface of the ceiling plate when the microwave frequency is varied. In FIG. 4, a higher temperature is indicated by white and a lower temperature is indicated by black (such a definition is also applied in FIGS. 5, 6, 7 and 9 to be described below). As shown in FIG. 4, even in such a narrow frequency range, the center temperature is relatively high (center high) and the corner temperature is relatively high (corner high). That is to say, a change in the temperature distribution is manifested in the center and the corner. Even at the same frequency, the temperature distribution is varied by changing power. The change in temperature distribution corresponds to a change in plasma impedance.

Next, using the experimental apparatus of FIG. 3, under the condition that an argon mixed gas composed of a $NH_3$ gas, a $H_2$ gas and an Ar gas is used as a processing gas and the internal pressure of the chamber is set to 2 Torr as in the above and under the condition that the microwave power is set to 2,000 W (partially 1,800 W), the microwave frequency was varied in a range of 2,450 to 2,470 MHz. A sufficient output was not obtained at 2,400 MHz, but plasma was generated in a range of 2,410 to 2,500 MHz. The results of temperature distribution measurement in the lower surface of the ceiling plate at that time are shown in FIG. 5. As shown in FIG. 5, at 2,410 to 2,430 MHz, a tendency of higher corner than 2,455 MHz which was the corner high in FIG. 4 was obtained. At 2,465 MHz, a tendency of center high was obtained, but a distribution ignited only at the center could not be obtained.

Figure 6:
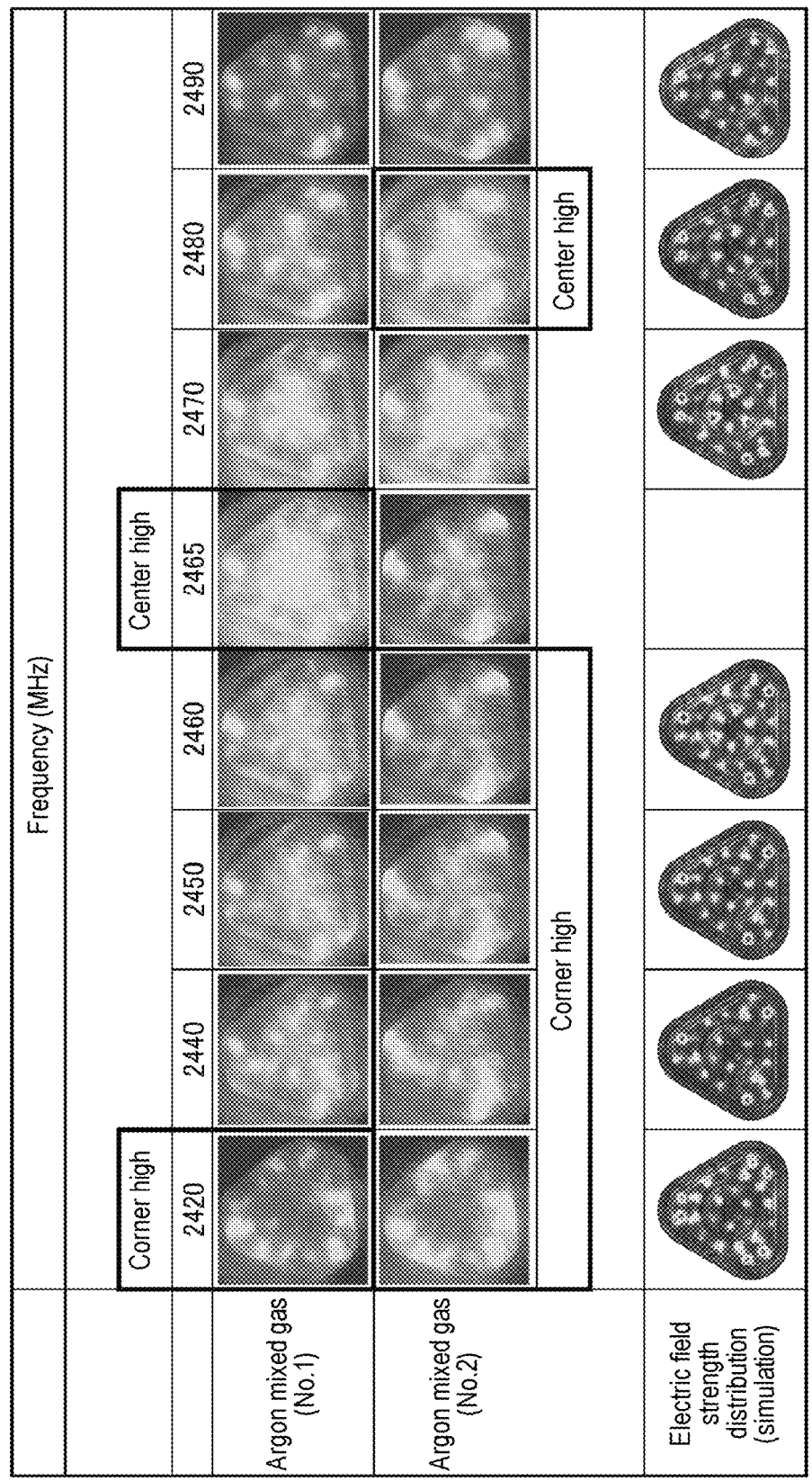
FIG. 6 is a view showing the results of temperature distribution measurement in a bottom surface of a ceiling plate and the results of electric field strength distribution measurement by a simulation when a microwave frequency is changed in a range of 2,420 to 2,490 MHz using two kinds of gas systems.

Next, using the experimental apparatus of FIG. 3, an experiment was conducted under the condition that a gas system was changed. Here, under the condition that the internal pressure of the chamber is 2 Torr, the microwave power is 2,000 W and the gas system corresponds to an argon mixed gas having two composition ratios (No. 1 and No. 2), the microwave frequency was varied in a range of 2,420 to 2,490 MHz. FIG. 6 shows the results of temperature distribution measurement in the lower surface of the ceiling plate and the results of electric field intensity distribution measurement obtained by a simulation. As shown in FIG. 6, it was confirmed that a frequency at which the center is high differs due to a difference in the gas system. In addition, No. 2 tended to have a larger variation range of center high and corner high than No. 1. In addition, it can be seen that the temperature distribution in the lower surface of the ceiling plate obtained by the experiment is in good agreement with the results of electric field intensity distribution measurement obtained by the simulation.

From this, it can be seen that the temperature distribution in the lower surface of the ceiling plate can be controlled by changing the microwave frequency. In addition, since the temperature of the lower surface of the ceiling plate corresponds to the plasma density, it can be seen that the plasma density distribution can be controlled by varying the microwave frequency. In addition, when the microwave power, the gas condition or the like are changed, the temperature distribution in the lower surface of the ceiling plate, namely the plasma density distribution, was changed. Further, it was also confirmed that such plasma density distribution can be adjusted by varying the microwave frequency.

Next, a monitoring means for monitoring the plasma density distribution was verified.

Figure 7:
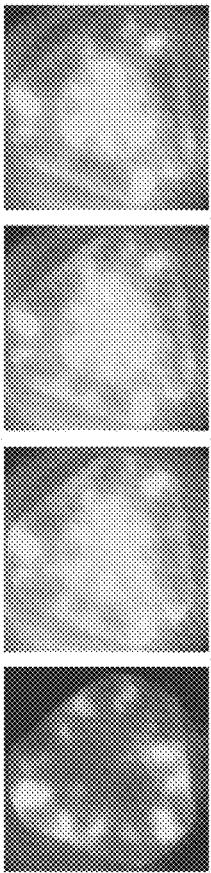
FIG. 7 is a view showing the results of temperature distribution measurement in a bottom surface of a ceiling plate, a tapper connector temperature and an IR center temperature when a microwave frequency is changed.
Figure 7:
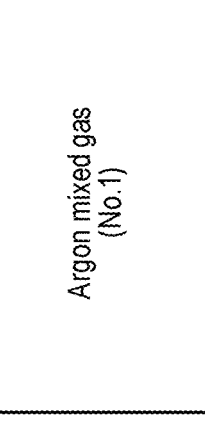
Figure 7:
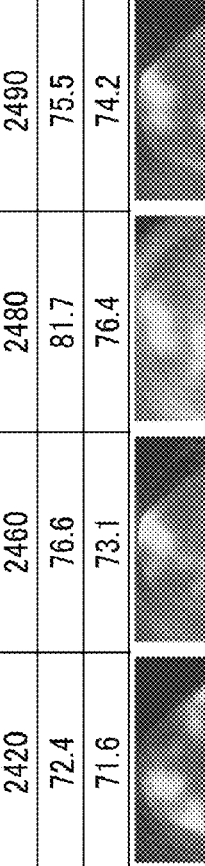
Figure 7:
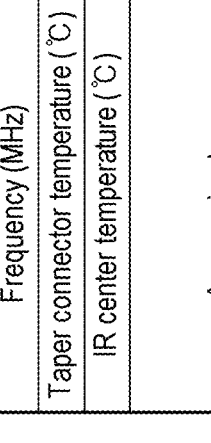
Figure 7:
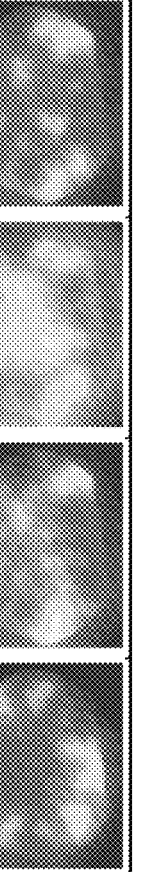
Figure 7:
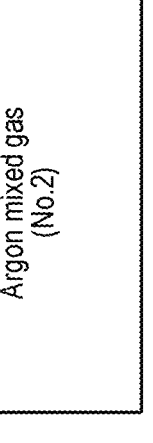
Figure 7:
Figure 7:
Figure 8:
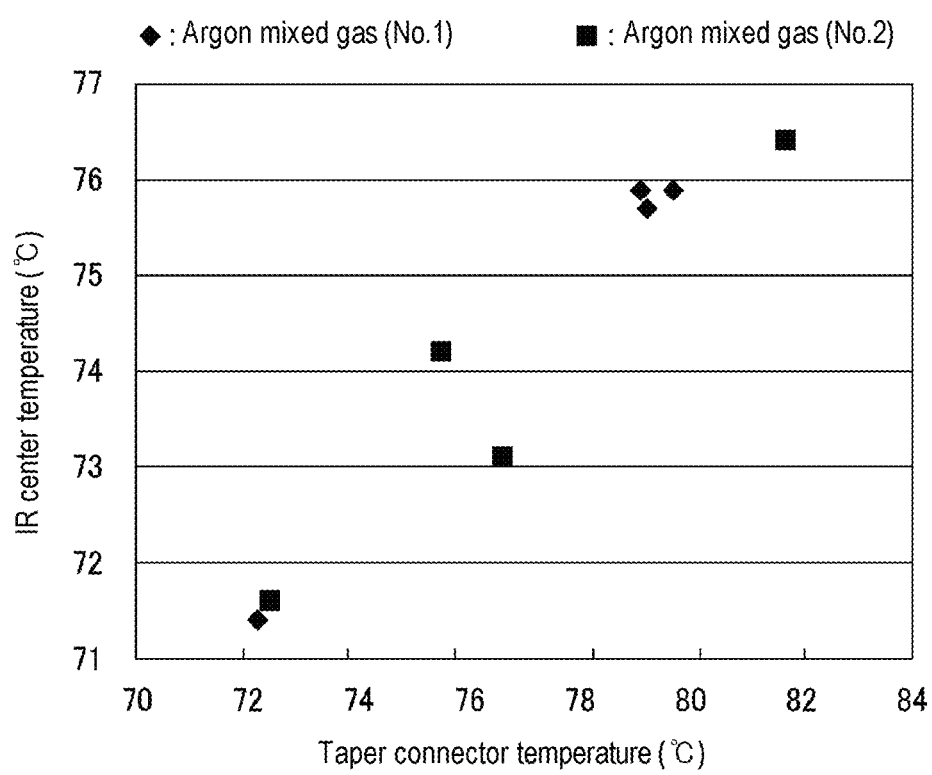
FIG. 8 is a view showing the relationship between a tapered connector temperature and an IR center temperature when a microwave frequency is changed.

Here, as the monitoring means for monitoring the plasma density distribution, a thermocouple serving as a temperature detector was installed in a tapered connector of a coaxial waveguide which corresponds to the center of the antenna outside the chamber of the antenna part and the correlation with the temperature at the center of the bottom surface of the ceiling plate was obtained. Here, under the conditions that the internal pressure of the chamber is 2 Torr, the microwave power is 2,000 W and the gas system corresponds to an argon mixed gas having two composition ratios (No. 1 and No. 2) as in the experiment of FIG. 6, the microwave frequency was varied. FIG. 7 shows the results of temperature distribution measurement in the lower surface of the ceiling plate, the temperature of the tapered connector and the temperature (IR center temperature) of the center of the ceiling plate obtained by IR. As shown in FIG. 7, it was confirmed that, when the temperature distribution (plasma density distribution) in the lower surface of the ceiling plate is changed by varying the microwave frequency with the microwave power fixed, the temperature of the tapered connector varies together with the IR center temperature. The relationship at that time is shown in FIG. 8. As can be seen from FIG. 8, it was confirmed that there is an extremely effective correlation between the temperature of the tapered connector and the IR center temperature. Similarly, by installing a thermocouple at a position corresponding to the edge portion of the antenna portion outside the chamber, it is possible to monitor the temperature of the edge portion of the bottom surface of the ceiling plate.

Figure 10:
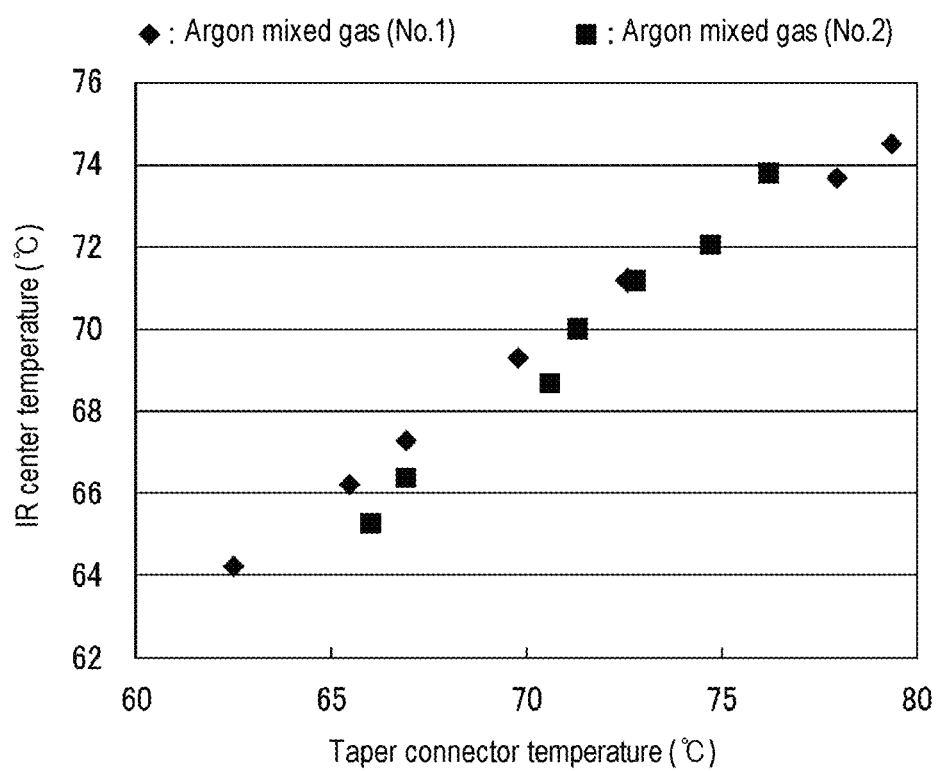
FIG. 10 is a view showing the relationship between a tapered connector temperature and an IR center temperature when power is changed while a microwave frequency is fixed.

Next, a verification was conducted to check the results of temperature distribution measurement on the lower surface of the ceiling plate, which is available when changing the power with the microwave frequency fixed, and the correlation between the temperature of the tapered connector and the IR center temperature. Here, under the conditions that the microwave frequency is fixed at 2,460 MHz, the internal pressure of the chamber is 2 Torr and the gas system corresponds to an argon mixed gas having two composition ratios (No. 1 and No. 2) as in the experiment of FIG. 6, the microwave power was changed. FIG. 9 shows the results of temperature distribution measurement in the lower surface of the ceiling plate obtained at that time and FIG. 10 shows the relationship between the temperature of the tapered connector and the IR center temperature. As can be seen from FIGS. 9 and 10, it was confirmed that the temperature distribution (plasma density distribution) in the lower surface of the ceiling plate is changed with the change of the microwave power, which changes the IR center temperature. From this, it was found that there is an extremely effective correlation between the temperature of the tapered connector and the IR center temperature.

<Other Applications>

Although the embodiments of the present disclosure have been described above with reference to the accompanying drawings, the present disclosure is not limited to the above-described embodiments but may be modified in various ways without departing from the spirit and scope of the present disclosure.

For example, although the nitriding process and the plasma CVD and the ALD have been described as examples of the microwave plasma process in the above-described embodiment, the present disclosure is not limited thereto but may be applied to other plasma process such as a plasma etching, a plasma oxidation and so on.

In addition, the case where the plasma process is performed on the wafer mounted on the fixed mounting table has been described in the above embodiment. However, for example, the plasma process may be performed using an apparatus for performing a plasma process on a wafer when the wafer passes through a microwave plasma source by moving the wafer mounted on a movable mounting table such as a rotary table. Such an apparatus may be a rotary type ALD film forming apparatus in which a microwave plasma source for plasmarizing a reaction gas is disposed in a portion through which a wafer passes, a mechanism for supplying a precursor gas is installed in another portion, and the precursor gas and the plasmarized reaction gas are alternately supplied to form a predetermined film.

Further, although an example in which the temperatures of the central portion and the edge portion of the antenna part outside the chamber are detected by the thermocouple has been described in the above-described embodiment, the temperature detection position is not limited to the central portion and the edge portion but is optional. In addition, the temperature detector is not limited to a thermocouple.

Moreover, although the case where the semiconductor wafer is used as a target substrate has been described in the above-described embodiment, the present disclosure is not limited to the semiconductor wafer but may be applied to other workpieces such as a glass substrate, a ceramic substrate or the like.

According to the present disclosure in some embodiments, it is possible to adjust a plasma density distribution by modulating an oscillation frequency of microwave. Further, it is possible to monitor the plasma density distribution by measuring temperatures at a plurality of positions of an antenna part outside a chamber. Therefore, it is possible to control the plasma density distribution with high precision by controlling the oscillation frequency of the microwave based on the monitored plasma density distribution.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A microwave plasma source for generating a microwave plasma inside a chamber by radiating a microwave into the chamber, comprising:
   a microwave oscillator configured to oscillate the microwave and vary an oscillation frequency of the microwave;
   a waveguide through which the microwave oscillated by the microwave oscillator propagates;
   an antenna part including a slot antenna and a microwave-transmitting plate, the slot antenna being configured to radiate the microwave propagating through the waveguide into the chamber and having a predetermined pattern of slots formed therein, and the microwave-transmitting plate constituting a ceiling plate of the chamber and being made of a dielectric material through which the microwave radiated from the slots transmits;
   a plurality of temperature detectors configured to detect temperatures at a plurality of positions of the antenna part outside the chamber when the microwave plasma is generated inside the chamber; and
   a frequency controller configured to receive detection signals obtained by the plurality of temperature detectors and control the oscillation frequency of the microwave oscillator so that a plasma density distribution inside the chamber becomes a desired distribution, based on the detection signals.

2. The microwave plasma source of claim 1, wherein the plurality of temperature detectors are respectively located at a central portion and an edge portion of the antenna part.

3. The microwave plasma source of claim 2, wherein the waveguide includes:
   a waveguide pipe for propagating the microwave generated by the microwave oscillator in a TE mode therethrough;
   a mode converter configured to convert a propagation mode of the microwave guided through the waveguide pipe from the TE mode to a TEM mode; and
   a coaxial waveguide pipe for guiding the microwave converted into the TEM mode by the mode converter to the antenna part therethrough.

4. The microwave plasma source of claim 3, wherein the waveguide further includes a tapered connector as a portion of the antenna part which is located at a lower end portion of an inner conductor of the coaxial waveguide pipe,
   wherein the temperature detector located at the central portion of the antenna part is disposed in the tapered connector.

5. The microwave plasma source of claim 3, wherein the antenna part further includes:
   a slow-wave member made of a dielectric material and located on the slot antenna; and
   a shield lid made of a metal material and that covers the slot antenna and the slow-wave member,
   wherein the temperature detector located at the edge portion of the antenna part is disposed at an edge portion of the shield lid.

6. The microwave plasma source of claim 1, wherein the plurality of temperature detectors are thermocouples.

7. The microwave plasma source of claim 1, wherein the microwave oscillator includes:
   a signal generator configured to generate a signal; and
   a solid state amplifier configured to amplify a waveform of the signal generated from the signal generator and oscillate the microwave with a predetermined power, the solid state amplifier having a frequency modulation function.

8. A microwave plasma processing apparatus comprising:
   a chamber in which a workpiece is accommodated;
   a microwave oscillator configured to oscillate the microwave and vary an oscillation frequency of the microwave;
   a waveguide through which the microwave oscillated by the microwave oscillator propagates;
   an antenna part including a slot antenna and a microwave-transmitting plate, the slot antenna being configured to radiate the microwave propagating through the waveguide into the chamber and having a predetermined pattern of slots formed therein, and the microwave-transmitting plate constituting a ceiling plate of the chamber and being made of a dielectric material through which the microwave radiated from the slots transmits;
   a plurality of temperature detectors configured to detect temperatures at a plurality of positions of the antenna part outside the chamber when the microwave plasma is generated inside the chamber; and a frequency controller configured to receive detection signals obtained by the plurality of temperature detectors and control the oscillation frequency of the microwave oscillator so that a plasma density distribution inside the chamber becomes a desired distribution, based on the detection signals;

a gas supply mechanism configured to supply a plasma processing gas into the chamber; and an exhaust mechanism configured to exhaust an interior of the chamber.

9. The microwave plasma processing apparatus of claim 8, wherein the plurality of temperature detectors are respectively located at a central portion and an edge portion of the antenna part.

10. The microwave plasma processing apparatus of claim 9, wherein the waveguide includes:
   a waveguide pipe for propagating the microwave generated by the microwave oscillator in a TE mode therethrough;
   a mode converter configured to convert a propagation mode of the microwave guided through the waveguide pipe from the TE mode to a TEM mode; and
   a coaxial waveguide pipe for guiding the microwave converted into the TEM mode by the mode converter to the antenna part therethrough.

11. The microwave plasma processing apparatus of claim 10, wherein the waveguide further includes a tapered connector as a portion of the antenna part which is located at a lower end portion of an inner conductor of the coaxial waveguide pipe,
   wherein the temperature detector located at the central portion of the antenna part is disposed in the tapered connector.

12. The microwave plasma processing apparatus of claim 10, wherein the antenna part further includes:
   a slow-wave member made of a dielectric material and located on the slot antenna; and
   a shield lid made of a metal material and that covers the slot antenna and the slow-wave member,
   wherein the temperature detector located at the edge portion of the antenna part is disposed at an edge portion of the shield lid.

13. The microwave plasma processing apparatus of claim 8, wherein the plurality of temperature detectors are thermocouples.

14. The microwave plasma processing apparatus of claim 8, wherein the microwave oscillator includes:
   a signal generator configured to generate a signal; and
   a solid state amplifier configured to amplify a waveform of the signal generated from the signal generator and oscillate the microwave with a predetermined power, the solid state amplifier having a frequency modulation function.

* * * * *